(12) United States Patent
Seyama et al.

(10) Patent No.: US 11,469,125 B2
(45) Date of Patent: Oct. 11, 2022

(54) DEVICE AND METHOD FOR LINEARLY MOVING FIRST AND SECOND MOVING BODIES RELATIVE TO TARGET OBJECT

(71) Applicant: SHINKAWA LTD., Tokyo (JP)

(72) Inventors: Kohei Seyama, Tokyo (JP); Tetsuya Utano, Tokyo (JP); Yuichiro Noguchi, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 43 days.

(21) Appl. No.: 16/650,871

(22) PCT Filed: Aug. 28, 2018

(86) PCT No.: PCT/JP2018/031737
§ 371 (c)(1),
(2) Date: May 4, 2020

(87) PCT Pub. No.: WO2019/044816
PCT Pub. Date: Mar. 7, 2019

(65) Prior Publication Data
US 2020/0279762 A1     Sep. 3, 2020

(30) Foreign Application Priority Data

Aug. 28, 2017  (JP) .............................. JP2017-163110

(51) Int. Cl.
*H01L 21/677* (2006.01)
*H01L 21/52* (2006.01)
(Continued)

(52) U.S. Cl.
CPC ........ *H01L 21/67706* (2013.01); *G05B 19/19* (2013.01); *G05B 19/195* (2013.01); *H01L 21/52* (2013.01); *H02K 41/02* (2013.01)

(58) Field of Classification Search
CPC .......................... H01L 21/67706; H01L 21/52
See application file for complete search history.

(56) References Cited

U.S. PATENT DOCUMENTS

| 6,464,126 B2 | 10/2002 | Hayata et al. | |
| 2016/0194159 A1* | 7/2016 | Pang | B65G 49/064 |
| | | | 198/340 |

(Continued)

FOREIGN PATENT DOCUMENTS

| JP | S62173151 | 7/1987 |
| JP | H0964085 | 3/1997 |

(Continued)

OTHER PUBLICATIONS

"International Search Report (Form PCT/ISA/210) of PCT/JP2018/031737," dated Nov. 20, 2018, with English translation thereof, pp. 1-4.

*Primary Examiner* — Gerald McClain
(74) *Attorney, Agent, or Firm* — JCIPRNET

(57) ABSTRACT

A device for linearly moving bases with respect to an object, includes first and second bases, a linear scale provided with graduations at pitches in the moving direction, first and second encoder heads attached to the first and second bases, and a control unit. The control unit maintains an interval between the first and second encoder heads to be constant, and moves the first and second bases while sequentially detects a first and second graduation numbers, and calculates a distance on the scale between the first and second encoder heads by multiplying a difference between the first and second graduation numbers by the pitch, and calculates a position correction coefficient of the scale as a ratio of the interval with respect to the calculated distance, and controls the movement amount of the first movable body and the second movable body based on the position correction coefficient.

15 Claims, 10 Drawing Sheets

(51) Int. Cl.
 *H02K 41/02* (2006.01)
 *G05B 19/19* (2006.01)

(56) References Cited

U.S. PATENT DOCUMENTS

2017/0309503 A1* 10/2017 Seyama ............. H05K 13/0406
2020/0411352 A1* 12/2020 Seyama ................. H01L 24/78

FOREIGN PATENT DOCUMENTS

| | | |
|---|---|---|
| JP | 2001203234 | 7/2001 |
| JP | 2004167641 | 6/2004 |
| JP | 2013195778 | 9/2013 |
| JP | 2016139750 | 8/2016 |
| WO | 2016098448 | 6/2016 |

\* cited by examiner

DEVICE AND METHOD FOR LINEARLY MOVING FIRST AND SECOND MOVING BODIES RELATIVE TO TARGET OBJECT

CROSS-REFERENCE TO RELATED APPLICATION

This application is a 371 application of the international PCT application serial no. PCT/JP2018/031737, filed on Aug. 28, 2018, which claims the priority benefit of Japan application no. 2017-163110, filed on Aug. 28, 2017. The entirety of the above-mentioned patent application is hereby incorporated by reference herein and made a part of this specification.

BACKGROUND OF THE INVENTION

Technical Field

The present invention relates to a device and a method for linearly moving first and second movable bodies with respect to an object.

Related Art

For example, in the manufacture of semiconductor devices, mounting devices that mount electronic components such as a semiconductor die on a substrate or another semiconductor die, or many bonding devices such as wire bonding devices that bond wires to electrodes of a semiconductor die and electrodes of a substrate are used. The bonding device includes: a bonding head mounted on an XY table, a bonding arm that is attached to the bonding head and moves a bonding tool in an up-down direction, and a position detection camera that is attached to the bonding head and detects the bonding position of the substrate. A center line of the bonding tool and an optical axis of the position detection camera are disposed apart from each other at a predetermined offset distance. Besides, in many cases, after the optical axis of the position detection camera is aligned with the bonding position, bonding is performed by moving the bonding head by the offset distance and moving the center line of the bonding tool to the bonding position.

On the other hand, when the bonding operation is continued, the offset distance changes due to temperature rise. Therefore, even if the bonding head is moved by the offset distance after the optical axis of the position detection camera is aligned with the bonding position, the center line of the bonding tool may not be the bonding position. Thus, a bonding device for calibrating the offset distance in the middle of the bonding operation has been proposed (for example, see patent literature 1)

LITERATURE OF RELATED ART

Patent Literature

Patent literature 1: Japanese Patent Laid-Open No. 2001-203234

SUMMARY

Problems to be Solved

Meanwhile, in many bonding devices, a linear scale is used for detection of the amount of movement of a base having a bonding head. In this case, there is a problem that when the temperature of the bonding device rises, the linear scale expands and an error is generated in the amount of movement of the base that moves based on graduations of the linear scale. In addition, because the temperature rise of the linear scale is not uniform, the thermal expansion amount of the linear scale often differs depending on sections. Therefore, there is a problem that the mounting precision of electronic components is reduced due to reduction in the position detection precision of the bonding head.

Thus, the objective of the present invention is to improve the movement precision of a movable body.

Means to Solve Problems

The device of the present invention is a device for linearly moving a first movable body and a second movable body with respect to an object and includes: the first movable body that is guided by a rail to move linearly, the second movable body that is guided by the rail to move linearly, a scale disposed along the rail and provided with a plurality of graduations at predetermined pitches along a moving direction, a first detection unit that is disposed on the first movable body and detects graduation numbers of the scale, a second detection unit that is disposed on the second movable body and detects graduation numbers of the scale, and a control unit which maintains an interval between the first detection unit and the second detection unit at a predetermined interval and moves the first movable body and the second movable body along the rail while sequentially detects, by the first detection unit and the second detection unit, a first graduation number at which the first detection unit is positioned and a second graduation number at which the second detection unit is positioned, and controls a movement amount of the first movable body and the second movable body based on a ratio of the predetermined interval between the first and second detection units with respect to a distance on the scale between the first graduation number and the second graduation number.

In the device of the present invention, each of the first movable body and the second movable body may be a transport mechanism that transports a semiconductor die to the object; the object may be a substrate on which the semiconductor die that has been transported is mounted or other semiconductor die; and the device may be an device for mounting the semiconductor die on the object.

In the device of the present invention, the device may further include a first driving unit that drives the first movable body and a second driving unit that drives the second movable body; the control unit may drive one of the first driving unit or the second driving unit to press one of the first movable body or the second movable body against the other, and simultaneously move the first movable body and the second movable body while maintaining the interval between the first detection unit and the second detection unit at the predetermined interval.

In the device of the present invention, the control unit may calculate a position correction coefficient for each predetermined number of graduations from one end of the scale based on the ratio of the predetermined interval with respect to the distance on the scale between the first graduation number and the second graduation number.

The device of the present invention may include a distance detector that detects a distance of the first movable body or the second movable body from a reference position; the control unit may move the first movable body and the second movable body by a reference distance while maintaining the first detection unit and the second detection unit at the predetermined interval and detecting the distance of the first movable body or the second movable body from the reference position by the distance detector, detect, by the first detection unit and the second detection unit, a graduation number difference of the scale before and after moving the first movable body and the second movable body by the reference distance, and correct the movement amount based on the reference distance and the graduation number difference.

The device of the present invention may include: a reference member in which position marks are disposed separated by a reference distance, a first image acquisition part attached to the first movable body and acquiring an image of the position marks, and a second image acquisition part attached to the second movable body and acquiring an image of the position marks; wherein the control unit may move the first movable body and the second movable body by the reference distance based on the image of the position marks obtained by the first image acquisition part or the second image acquisition part, detect, by the first detection unit or the second detection unit, the graduation number difference of the scale before and after moving the first movable body and the second movable body, and correct the movement amount based on the reference distance and the graduation number difference.

The device of the present invention may include a mounting stage for mounting electronic components; wherein the rail may be two linear guides extending in an X-direction; the first movable body may be a first gantry frame which extends in a Y-direction so as to pass over the mounting stage and of which both ends are guided by the two linear guides to move in the X-direction, and the second movable body may be a second gantry frame which extends in the Y-direction in parallel with the first gantry frame so as to pass over the mounting stage and of which both ends are guided by the two linear guides to move in the X-direction; the scale may be disposed along one of the linear guides; the first detection unit may be attached to the end of the first gantry frame on the scale side, and the second detection unit may be attached to the end of the second gantry frame on the scale side.

The method of the present invention is a method for linearly moving a first movable body and a second movable body with respect to an object and includes: a step for preparing a device comprising the first movable body that is guided by a rail to move linearly, the second movable body that is guided by the rail to move linearly, a scale disposed along the rail and provided with a plurality of graduations at predetermined pitches along a moving direction, a first detection unit disposed on the first movable body, and a second detection unit disposed on the second movable body; a graduation number detection step for maintaining an interval between the first detection unit and the second detection unit at a predetermined interval, moving the first moving portion and the second moving portion along the rail, while sequentially detecting, by the first detection unit and the second detection unit, a first graduation number at which the first detection unit is positioned and a second graduation number at which the second detection unit is positioned; and a movement amount control step for controlling the movement amount of the first movable body and the second movable body based on a ratio of the predetermined interval between the first detection unit and the second detection unit with respect to a distance on the scale between the first graduation number and the second graduation number.

The method of the present invention may include a correction coefficient calculation step for calculating a position correction coefficient for each predetermined number of graduations from one end of the scale based on the ratio of the predetermined interval with respect to the distance on the scale between the first graduation number and the second graduation number.

In the method of the present invention, the device may include a distance detector that detects a distance of the first movable body or the second movable body from a reference position; and the method may include a movement amount correction step for maintaining the first detection unit and the second detection unit at the predetermined interval, detecting the distance of the first movable body or the second movable body from the reference position by the distance detector while moving the first movable body and the second movable body by a reference distance, detecting, by the first detection unit or the second detection unit, a graduation number difference of the scale before and after moving the first movable body and the second movable body by the reference distance, and correcting the movement amount based on the reference distance and the graduation number difference.

In the method of the present invention, the device may include: a reference member in which position marks are disposed separated by a reference distance, a first image acquisition part attached to the first movable body and acquiring an image of the position marks, and a second image acquisition part attached to the second movable body and acquiring an image of the position marks; and the method may include a movement amount correction step for moving the first movable body and the second movable body by the reference distance based on the image of the position mark obtained by the first image acquisition part or the second image acquisition part, detecting, by the first detection unit or the second detection unit, a graduation number difference of the scale before and after moving the first movable body and the second movable body, and correcting the movement amount based on the reference distance and the graduation number difference.

Effect

The present invention can improve the movement precision of a movable body.

DESCRIPTION OF THE EMBODIMENTS

<Configuration of Mounting Device>

Figure 1:
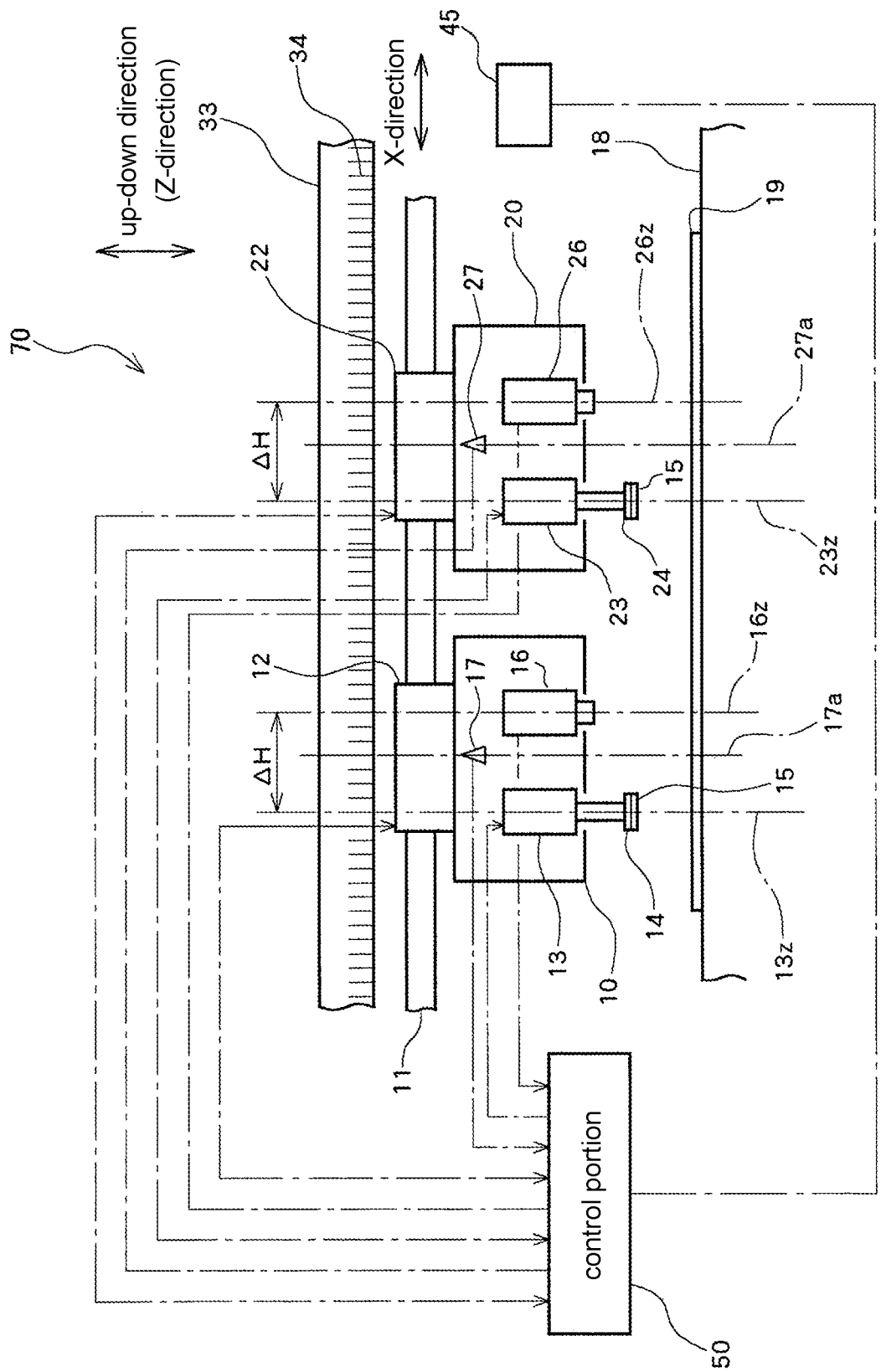
FIG. 1 is a system diagram showing a system configuration of a mounting device in an embodiment.

Hereinafter, a mounting device 70 for mounting a semiconductor die 15 on a substrate 19 or the like is described as an example of a device for linearly moving first and second movable bodies with respect to an object. As shown in FIG. 1, the mounting device 70 of this embodiment mounts the semiconductor die 15 on the substrate 19 or another semiconductor die serving as an object. The mounting device 70 includes a first base 10 serving as a first movable body to which a first bonding head 13 and a first camera 16 serving as a first image acquisition part are attached, a second base 20 serving as a second movable body to which a second bonding head 23 and a second camera 26 serving as a second image acquisition part are attached, a linear scale 33, a control unit 50, a laser distance detector 45, and a bonding stage 18 for attracting and fixing the substrate 19 serving as an object. The mounting device 70 is, for example, a flip-chip bonding device for mounting the semiconductor die 15 on the substrate 19 after inverting the semiconductor die 15. However, the mounting device 70 may also be a die bonding device for mounting the semiconductor die 15 on the substrate 19 without inverting the semiconductor die 15.

The first base 10 and the second base 20 are guided by a common guide rail 11 extending in an X-direction which is a linear direction to move linearly in the X-direction. In addition, a first linear motor 12 serving as a first driving unit that drives the first base 10 in the X-direction is attached to the first base 10, and a second linear motor 22 serving as a second driving unit that drives the second base 20 in the X-direction is attached to the second base 20.

The first bonding head 13 attached to the first base 10 causes a first bonding tool 14 to move in a Z-direction which is the vertical direction, the first bonding tool 14 being a mounting tool for vacuum-attracting the semiconductor die 15 and bonding the semiconductor die 15 to the substrate 19. The reference sign 13z in FIG. 1 denotes a center line of the first bonding head 13 in the Z-direction. The first camera 16 captures an image of the substrate 19 from above and acquires the image. The reference sign 16z in FIG. 1 denotes an optical axis of the first camera 16. The first bonding head 13 and the first camera 16 are attached to the first base 10 in a manner that the center line 13z and the optical axis 16z are separated in the X-direction by an offset amount ΔH. Similarly, the second bonding head 23 attached to the second base 20 causes a second bonding tool 24 to move in the Z-direction which is a vertical direction, the second bonding tool 24 being a mounting tool for vacuum-attracting the semiconductor die 15 and bonding the semiconductor die 15 to the substrate 19. The reference sign 23z in FIG. 1 denotes a center line of the second bonding head 23 in the Z-direction. The second camera 26 captures an image of the substrate 19 from above and acquires the image. The reference sign 26z in FIG. 1 denotes an optical axis of the second camera 26. The second bonding head 23 and the second camera 26 are attached to the second base 20 in a manner that the center line 23z and the optical axis 26z are separated in the X-direction by the offset amount ΔH. The first base 10 and the second base 20 are transport mechanisms that transport the semiconductor die 15 attracted by the first bonding tool 14 and the second bonding tool 24 to the substrate 19.

A first encoder head 17 serving as a first detection unit is attached to the substantial center of the first base 10, and a second encoder head 27 serving as a second detection unit is attached to the substantial center of the second base 20. Reference signs 17a and 27a in FIG. 1 respectively denote a center line of the first encoder head 17 and a center line of the second encoder head 27.

At a position facing the first encoder head 17 and the second encoder head 27, the common linear scale 33 extending in the X-direction which is the moving direction of the first base 10 and the second base 20 is disposed. A plurality of graduations 34 is engraved in the linear scale 33 at predetermined pitches p. The first encoder head 17 and the second encoder head 27 optically read the graduations 34 to detect the graduation number on the linear scale 33.

The bonding stage 18 vacuum-attracts the substrate 19.

The laser distance detector 45 is disposed at a position separated from the bonding stage 18, and detects, by laser, a distance of the first base 10 or the second base 20 from a reference position in the X-direction. The laser distance detector 45 can detect the distance of the first base 10 and the second base 20 from the reference position in the X-direction regardless of a change in the length of the linear scale 33 caused by a temperature change of the mounting device 70.

As shown in FIG. 1, the first linear motor 12, the second linear motor 22, the first bonding head 13, and the second bonding head 23 are connected to the control unit 50 and operate according to commands from the control unit 50. In addition, the first encoder head 17 and the second encoder head 27 are connected to the control unit 50, and data of the detected graduation number of the linear scale 33 is input to the control unit 50. In addition, the first camera 16, the second camera 26, and the laser distance detector 45 are also connected to the control unit 50; the images captured by the first camera 16 and the second camera 26, and data of the movement distance of the first base 10 or the second base 20 in the X-direction detected by the laser distance detector 45 are input to the control unit 50.

The control unit 50 is a computer including a CPU that performs information processing therein, and a memory in which operation programs and data are stored, and adjusts the X-direction positions or movement amount of the first base 10 and the second base 20.

<Basic Operation of Mounting Device>

The basic operation of the mounting device 70 shown in FIG. 1 is described briefly. The control unit 50 captures an image of a mark indicating the bonding position of the substrate 19 by the first camera 16 and analyzes the captured image to detect a difference Δc between the position of the bonding center and the position of the optical axis 16z. Then, the first base 10 is moved in the X-direction by the first linear motor 12 by the sum of the offset amount ΔH and Δc. Thereby, the center line 13z of the first bonding head 13 can be aligned with the bonding center. Then, the control unit 50 lowers the first bonding tool 14 by the first bonding head 13 to bond the semiconductor die 15 to the bonding position of the substrate 19. The same applies to the operation when the semiconductor die 15 is bonded to the substrate 19 by the second bonding head 23.

<Calculation Operation (Calculation Method) for Position Correction Coefficient k(n) of Linear Scale in Mounting Device>

Next, the calculation operation for a position correction coefficient k(n) of the linear scale 33 is described with reference to FIGS. 2 and 3. When the linear scale 33, the first base 10 or the second base 20 thermally expands, an error may be generated when the first base 10 and the second base 20 are moved from the reference position of the mounting device 70 to a predetermined position. Thus, the calculation operation (calculation method) for the position correction coefficient of the linear scale 33 is described below.

Figure 2:
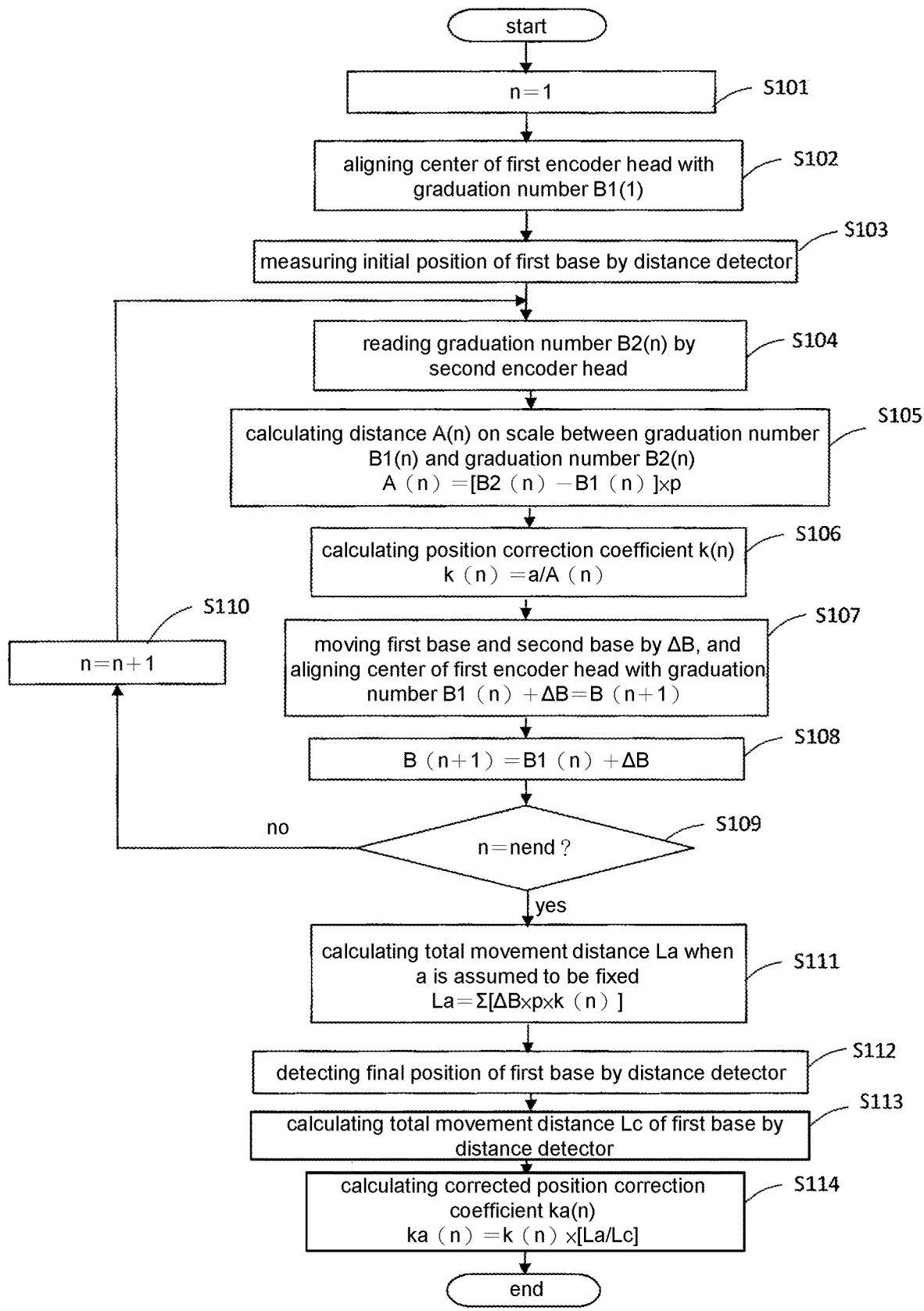
FIG. 2 is a flow chart showing a calculation operation for a position correction coefficient of a linear scale in the mounting device shown in FIG. 1.

As shown in step S101 of FIG. 2, the control unit 50 initially sets n to 1. Then, the control unit 50 sets the first base 10 at a movement start position B(0) at the left end shown in FIG. 3. Next, the control unit 50 moves the second base 20 to the left and brings the left end of the second base 20 into contact with the right end of the first base 10. Thereby, as shown in FIG. 3, an interval between the center line 17a of the first encoder head 17 and the center line 27a of the second encoder head 27 becomes a predetermined interval a.

Next, the control unit 50 drives the first linear motor 12 positioned on the rear side (left side in FIG. 3) of the moving direction (right direction in FIG. 3) in the right direction and moves the first base 10 to the right side in the X-direction. At this time, the first base 10 moves rightward in the X-direction while pressing the second base 20, and thus the second base 20 moves rightward in the X-direction together with the first base 10. In addition, because the first base 10 and the second base 20 are maintained in contact with each other, the interval between the center line 17a of the first encoder head 17 and the center line 27a of the second encoder head 27 is maintained at the predetermined interval a. Then, as shown in step S102 of FIG. 2 and in FIG. 3, the control unit 50 aligns the center line 17a of the first encoder head 17 with a first graduation number B1(1) of the linear scale 33. Next, in step S103 of FIG. 2, the control unit 50 detects, by the laser distance detector 45, the position of the first base 10 in the X-direction at this time as a reference position.

Next, as shown in step S104 of FIG. 2, the control unit 50 reads, by the second encoder head 27, a second graduation number B2(1) of the linear scale 33 at which the center line 27a of the second encoder head 27 is positioned. Then, the control unit 50 proceeds to step S105 of FIG. 2 and calculates a distance A(1) between the second graduation number B2(1) and the first graduation number B1(1) on the linear scale 33 by the following (Equation 1). The distance A(1) is also a distance between the center line 17a of the first encoder head 17 and the center line 27a of the second encoder head 27, which is detected by the linear scale 33.

$$A(1) = [B2(1) - B1(1)] \times p \quad \text{(Equation 1)}$$

In (Equation 1), the reference sign p denotes the pitch of the graduations 34 of the linear scale 33.

Next, the control unit 50 proceeds to step S106 of FIG. 2 and calculates a position correction coefficient k(1) of the linear scale 33 by the following (Equation 2). The position correction coefficient k(1) is a ratio of the predetermined interval a between the center line 17a of the first encoder head 17 and the center line 27a of the second encoder head 27 with respect to the distance A(1) on the linear scale 33 between the second graduation number B2(1) and the first graduation number B1(1).

$$k(1) = a/A(1) \quad \text{(Equation 2)}$$

steps S105 and S106 of FIG. 2 constitute a correction coefficient calculation step.

Next, the control unit 50 proceeds to step S107 of FIG. 2, causes the first base 10 to move in the X-direction by a predetermined number of graduations ΔB by the first linear motor 12, and aligns the center line 17a of the first encoder head 17 with the second graduation number B2(1)=B1(1)+ΔB. At this time, the second base 20 moves in the X-direction in contact with the first base 10, and thus the interval between the center line 17a of the first encoder head 17 and the center line 27a of the second encoder head 27 is maintained at the predetermined interval a.

Then, the control unit 50 proceeds to step S108 of FIG. 2 and stores B1(1)+ΔB to B1(2). The control unit 50 determines whether n reaches nend in step S109 of FIG. 2, and when n has not reached nend, the control unit 50 proceeds to step S110 of FIG. 2, increments n by 1 and returns to step S104 of FIG. 2 as n=n+1=2. Here, nend denotes the number of movement required until the first base 10 moves to an end position, and the first graduation number B1(nend) represents the graduation number of the linear scale 33 at which the center line 17a of the first encoder head 17 is positioned when the first base 10 moves to the end position. Steps S104 and S107-S110 of FIG. 2 constitute a graduation number detection step.

In this manner, the control unit 50 linearly moves the first base 10 and the second base 20 in the X-direction by the predetermined number of graduations ΔB of the linear scale 33, and sequentially detects, by the first encoder head 17 and the second encoder head 27, the first graduation number B1(n) of the linear scale 33 at which the center line 17a of the first encoder head 17 is positioned and the second graduation number B2(n) of the linear scale 33 at which the center line 27a of the second encoder head 27 is positioned. Then, the control unit 50 repeats an operation for calculating the position correction coefficient k(n) of the linear scale 33, which is the ratio of the predetermined interval a between the center line 17a of the first encoder head 17 and the center line 27a of the second encoder head 27 with respect to a distance A(n) on the linear scale 33 between the second graduation number B2(n) and the first graduation number B1(n). In this manner, the control unit 50 can calculate the position correction coefficient k(n) for each predetermined number of graduations ΔB from one end of the linear scale 33, and calculate the position correction coefficient k(n) of the linear scale 33 at each graduation number B(n) of the linear scale 33, as shown in the graph of FIG. 3.

Figure 3:
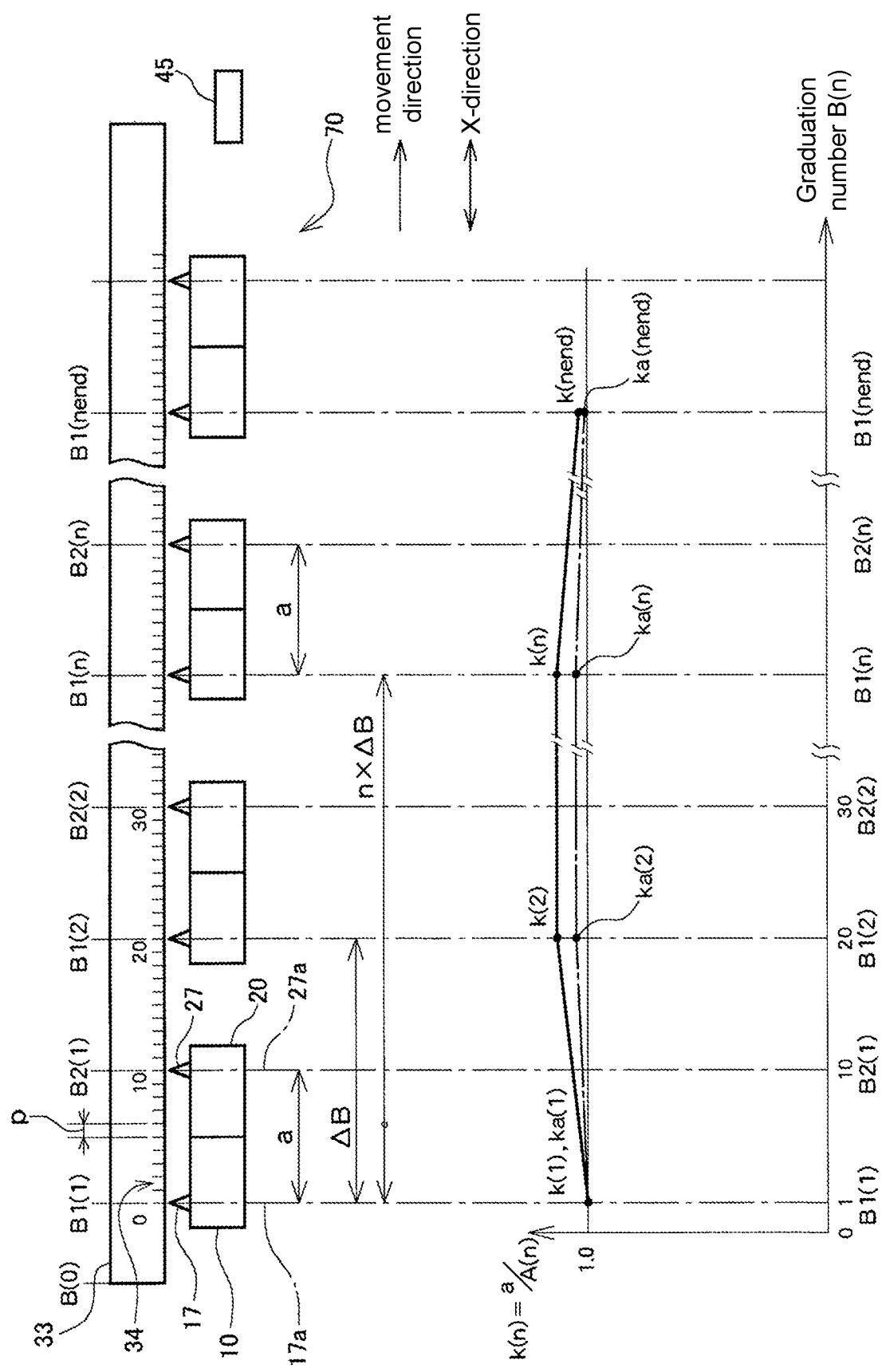
FIG. 3 is a graph showing a change in the positions of first and second bases with respect to the linear scale and a change in the position correction coefficient with respect to the linear scale during the operation shown in FIG. 2.

Now, when neither the linear scale 33 nor the first base 10 and the second base 20 thermally expand at room temperature, as shown in FIG. 3, if the first graduation number B1(1) at n=1 is set to 0, and the second graduation number B2(1) at n=1 is set to 10, $$A(1) = [B2(1) - B1(1)] \times p = [10 - 0] \times p$$
$$= 10 \text{ graduations} \times p = a, \text{ and}$$
$$k(1) = a/A(1) = 1.0.$$

The linear scale 33 thermally expands at the position of n=2, but the predetermined interval a between the center line 17a of the first encoder head 17 and the center line 27a of the second encoder head 27 is set to be invariable. In this case, the pitch p of the graduations 34 of the linear scale 33 is p' (>p) due to the thermal expansion. When the center line 17a of the first encoder head 17 is aligned with the first graduation number B1(2)=20 at n=2, the number of graduations between the second graduation number B2(2) and the first graduation number B1(2) is less than 10 graduations in the case without thermal expansion, for example, 9 graduations. Therefore, the distance A(2) on the linear scale 33 between the second graduation number B2(2) and the first graduation number B1(2), or the distance A(2) between the center line 17a of the first encoder head 17 and the center line 27a of the second encoder head 27 which is detected by the linear scale 33 is $$A(2) = [B2(2) - B1(2)] \times p$$
$$= 9 \text{ graduations} \times p.$$

On the other hand, because the predetermined interval a between the center line 17a of the first encoder head 17 and the center line 27a of the second encoder head 27 is invariable and is 10 graduations×p, $$k(2)=a/A(2)=(10 \text{ graduations} \times p)/(9 \text{ graduations} \times p) > 1.0.$$

In this manner, when the linear scale 33 extends due to thermal expansion, the position correction coefficient k(n) becomes a number larger than 1.0. On the contrary, when the linear scale 33 contracts at a temperature lower than the normal temperature, the position correction coefficient k(n) becomes a number smaller than 1.0.

If the first base 10 is moved by the predetermined number of graduations ΔB in the X-direction when the linear scale 33 does not thermally expand, the first base 10 moves in the X-direction by ΔB×p. When the linear scale 33 thermally expands or contracts, the movement distance of the first base 10 becomes ΔB×p×k(n) with correction for thermal expansion or contraction. When the linear scale 33 thermally expands, k(n) is larger than 1.0, and thus the movement distance of the first base 10 and the second base 20 is larger than ΔB×p; when the linear scale 33 contracts, k(n) is smaller than 1.0, and thus the movement distance of the first base 10 and the second base 20 is smaller than ΔB×p. In addition, the movement distance of the first base 10 from the initial position to the end position is obtained by integrating ΔB×p×k(n) from n=1 to nend.

When n reaches nend, the control unit 50 proceeds to step S111 of FIG. 2 and calculates a total movement distance La of the first base 10 by the following (Equation 3).

$$La=\Sigma[\Delta B \times p \times k(n)] \quad \text{(Equation 3)}$$

La calculated by the above (Equation 3) is a total movement distance of the first base 10 when the predetermined interval a between the center line 17a of the first encoder head 17 and the center line 27a of the second encoder head 27 is invariable and the thermal expansion of the linear scale 33 is taken into consideration. However, the predetermined interval a also changes due to the thermal expansion of the first base 10 and the second base 20. Thus, the position correction coefficient k(n) is corrected in consideration of the thermal expansion amount of the predetermined interval a as described below.

The control unit 50 proceeds to step S112 of FIG. 2, detects the end position of the first base 10 by the laser distance detector 45, and proceeds to step S113 of FIG. 2 and calculates a movement distance Lc of the first base 10 from the reference position to the end position, the movement distance Lc being detected by the laser distance detector 45.

The control unit 50 proceeds to step S114 of FIG. 2 and corrects the position correction coefficient k(n) by the following (Equation 4) to obtain ka(n).

$$ka(n)=k(n) \times [La/Lc] \quad \text{(Equation 4)}$$

The control unit 50 stores the corrected position correction coefficient ka(n) in the memory. As shown in FIG. 3, the corrected position correction coefficient ka(n) shows distribution of the position correction coefficient ka(n) or a map of the position correction coefficient ka(n) of the linear scale 33 with respect to the graduation number B(n) of the linear scale 33 in consideration of a change in the predetermined interval a caused by thermal expansion. Steps S111-S114 of FIG. 2 constitute a correction coefficient correction step.

The control unit 50 uses the corrected position correction coefficient ka(n) to correct as follows the position of the center line 17a of the first encoder head 17 detected using the linear scale 33. When the graduation number of the linear scale 33 detected by the first encoder head 17 is B100 and B100=ΔB×m+j, the control unit 50 calculates a distance L100 from the graduation number 0 to the center line 17a of the first encoder head 17 as $$L100=[\Sigma \Delta B \times ka(n) \times p]_{(n=1-m)}+ka(m+1) \times j \times p, \text{ and}$$

controls the movement amount or movement distance of the first base 10.

In other words, in the case of no correction, the control unit 50 corrects, using the corrected position correction coefficient ka(n), a movement distance L100b=(ΔB×m+j)×p of the first encoder head 17 from the graduation number 0 to the graduation number B100 detected by the linear scale 33 to the distance L100=[ΣΔB×ka(n)×p]$_{(n=(1-m))}$+ka(m+1)×j×p) (a movement amount correction step); and the control unit 50 controls the movement amount or movement distance of the first base 10 to which the first encoder head 17 is attached (a movement amount control step). Similarly, the movement distance of the second base 20 to which the second encoder head 27 is attached is corrected, and the movement distance of the second base 20 is controlled.

As described above, the mounting device 70 of the embodiment linearly moves the first base 10 and the second base 20 in the X-direction by the predetermined number of graduations ΔB while maintaining the interval in the X-direction between the center line 17a of the first encoder head 17 and the center line 27a of the second encoder head 27 at the predetermined interval a, sequentially detects the graduation numbers by the first encoder head 17 and the second encoder head 27 to create a map of the position correction coefficient ka(n) of the linear scale 33, and corrects the movement distance of the first encoder head 17 and the second encoder head 27 based on the created map of the position correction coefficient ka(n); therefore, it is possible to improve the position detection precision of the first bonding head 13, the second bonding head 23, the first camera 16 and the second camera 26, and suppress reduction in the mounting precision of electronic components.

Besides, in the description of the embodiment, the first base 10 is brought into contact with the second base 20 to be driven in the X-direction by the first linear motor 12, and the second base 20 is moved together with the first base 10 in the X-direction while the state is maintained in which the first base 10 and the second base 20 are brought into contact by pressing of the first base 10 against the second base 20, so that the interval between the center line 17a of the first encoder head 17 and the center line 27a of the second encoder head 27 is maintained at the predetermined interval a, but the present invention is not limited hereto. For example, the first base 10 and the second base 20 may be temporarily connected by a connection member to maintain the interval between the center line 17a of the first encoder head 17 and the center line 27a of the second encoder head 27 at the predetermined interval a.

<Another Calculation Operation (Calculation Method) for Position Correction Coefficient k(n) of Linear Scale in Mounting Device>

Next, another calculation operation for the position correction coefficient k(n) of the linear scale of the mounting device 70 of the embodiment is described with reference to FIGS. 4 and 5. Operations the same as those described with reference to FIGS. 2 and 3 are denoted by the same step signs, and description thereof is omitted.

In the operations shown in FIG. 3, after the first base 10 and the second base 20 are moved by the predetermined number of graduations ΔB, and the movement graduation number of the linear scale 33 is detected by the first encoder head 17 and the second encoder head 27 to calculate each position correction coefficient k(n), the number of graduations when the first base 10 is moved by a reference distance Lr while the position of the first base 10 is detected by the laser distance detector 45 is detected, and the position correction coefficient k(n) is corrected based on this result. The calculation for each position correction coefficient k(n) is the same as that described above with reference to FIGS. 2 and 3, and description thereof is omitted.

Figure 4:
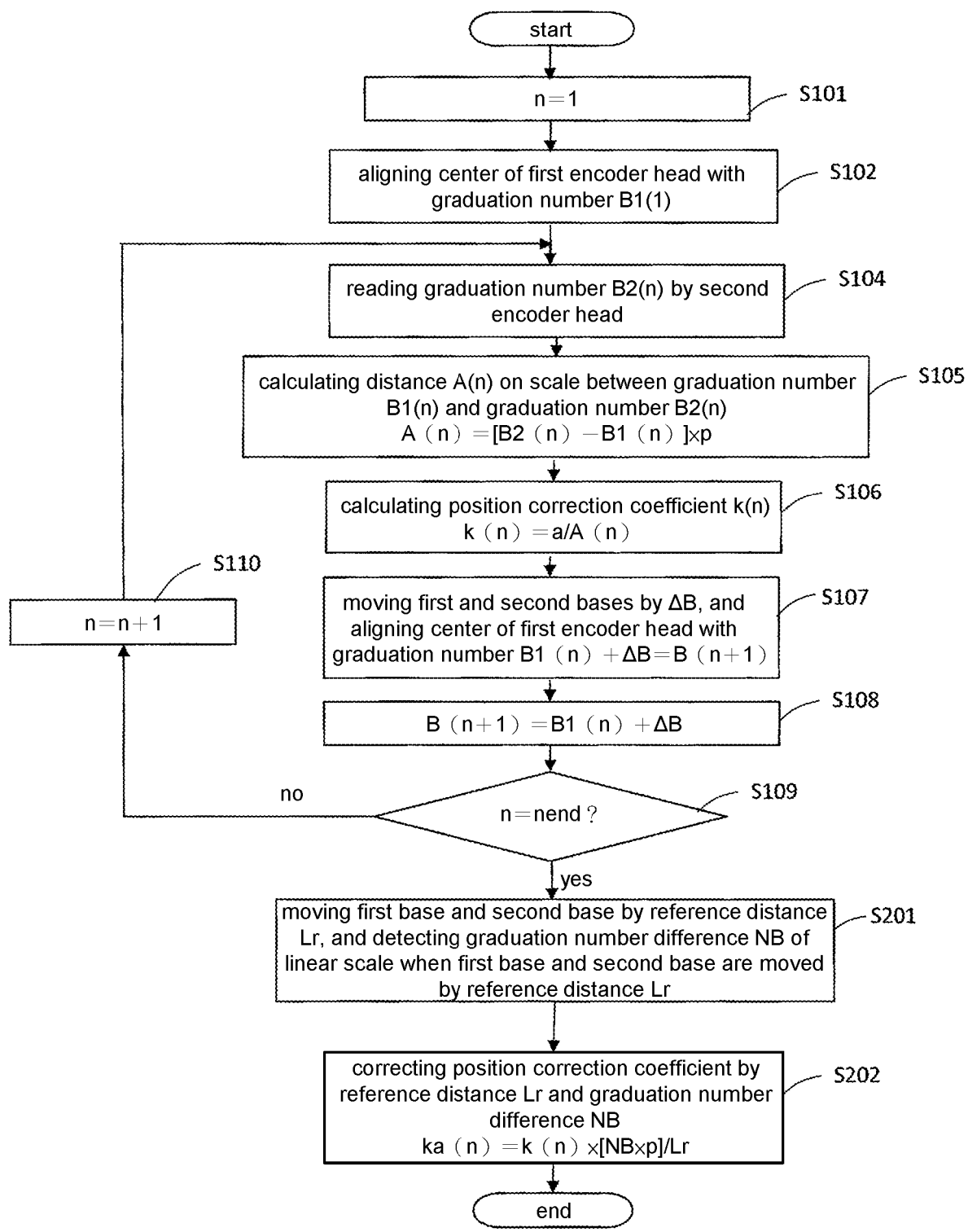
FIG. 4 is a flowchart showing another calculation for the position correction coefficient of the linear scale in the mounting device shown in FIG. 1.

After repeatedly executing steps S101-S110 of FIG. 4 to calculate k(n), the control unit 50 proceeds to step S201 of FIG. 4.

Figure 5:
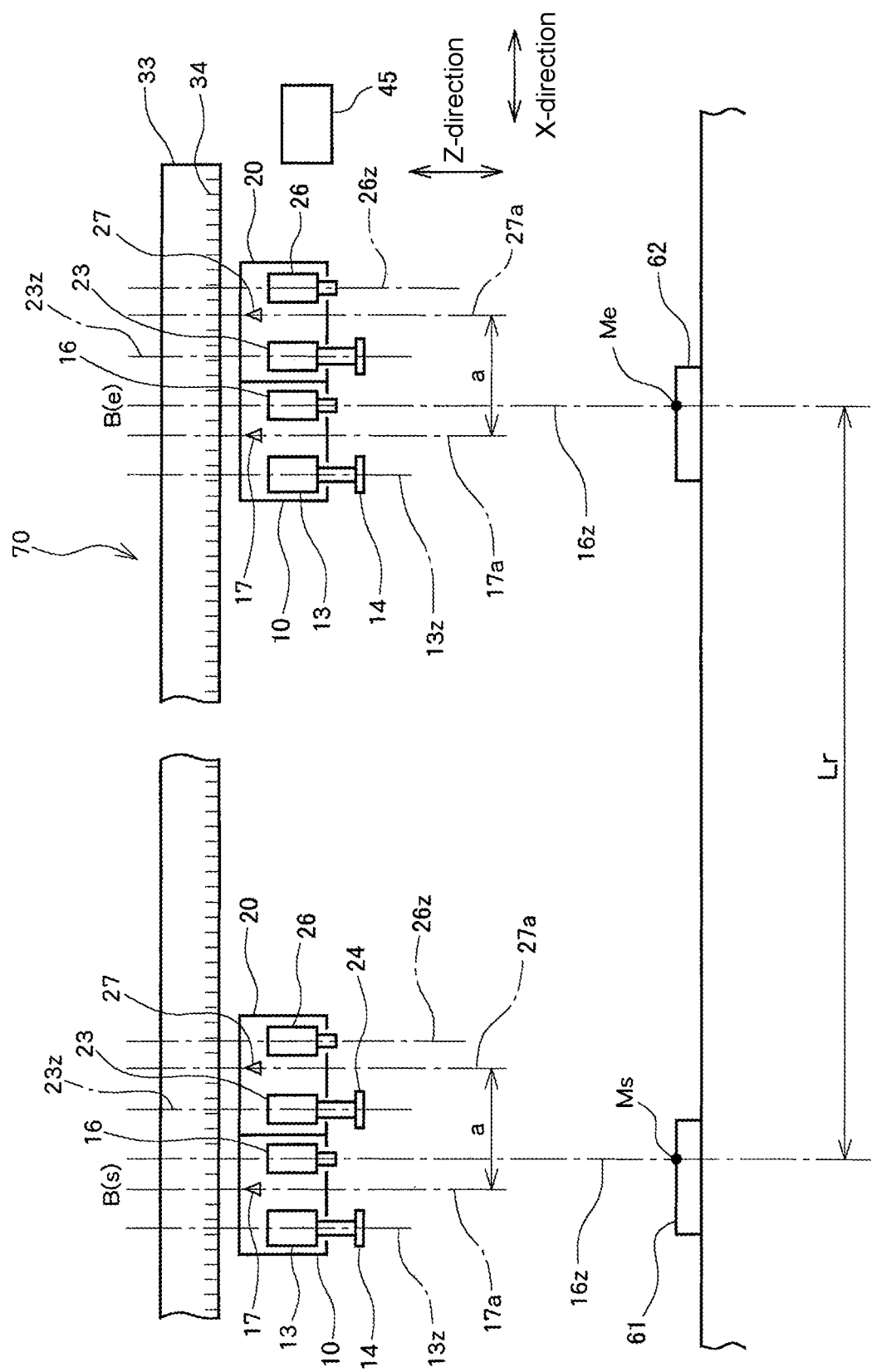
FIG. 5 is an illustration diagram showing a relationship among the linear scale, the first and second bases, and a reference member when the first and second bases are moved by a reference distance.

In step S201 of FIG. 4, as shown in FIG. 5, the control unit 50 aligns the first base 10 with a predetermined first position (reference position). Then, the control unit 50 detects, by the first encoder head 17, a graduation number B(s) of the linear scale 33 at which the first encoder head 17 is positioned when the first base 10 is at the first position. In addition, the control unit 50 detects a first distance from the laser distance detector 45 to the first base 10 by the laser distance detector 45. Next, the control unit 50 moves the first base 10 and the second base 20 by the reference distance Lr in the X-direction in the same manner as described above with reference to FIGS. 2 and 3 while detecting the distance to the first base 10 by the laser distance detector 45. When the first base 10 and the second base 20 move by the reference distance Lr and the first base 10 reaches a second position, the control unit 50 detects a graduation number B(e) of the linear scale 33 at the second position by the first encoder head 17. The control unit 50 calculates, from a difference=(B(e)−B(s)) between the graduation number B(s) at the first position and the graduation number B(e) at the second position, a graduation number difference NB=(B(e)−B(s)) of the linear scale 33 when the first base 10 moves by the reference distance Lr.

After detecting the graduation number difference NB, the control unit 50 proceeds to step S202 of FIG. 4 and corrects the position correction coefficient k(n) by the following (Equation 5).

$$ka(n)=k(n)\times[NB\times p]/Lr \quad \text{(Equation 5)}$$

As in the embodiment described above, the control unit 50 uses the corrected position correction coefficient ka(n) to correct the position of the center line 17a of the first encoder head 17 or the position of the center line 27a of the second encoder head 27 detected by the linear scale 33. In addition, the movement distance of the first encoder head 17 and the second encoder head 27 detected by the linear scale 33 is corrected using the corrected position correction coefficient ka(n) (the movement amount correction step), and the movement amount or movement distance of the first base 10 to which the first encoder head 17 is attached and the second base 20 to which the second encoder head 27 is attached is controlled (the movement amount control step).

Similar to the operations described above with reference to FIGS. 2 and 3, this operation can improve the position detection precision of the first bonding head 13, the second bonding head 23, the first camera 16 and the second camera 26, and suppress reduction in the mounting precision of electronic components. Besides, in the above description, the graduation numbers of the linear scale 33 when the first base 10 is at the first position and the second position are detected by the first encoder head 17. However, it may be that the graduation numbers of the linear scale 33 when the second base 20 is at the first position and the second position are detected by the second encoder head 27.

Next, another operation of steps S201 and S202 of FIG. 4 is described.

As shown in FIG. 5, the mounting device 70 of the embodiment includes a first reference member 61 in which a position mark Ms is disposed at the first position and a second reference member 62 in which a position mark Me is disposed at the second position.

In step S201 of FIG. 4, the control unit 50 aligns the optical axis 16z of the first camera 16 with the position of the position mark Ms of the first reference member 61, and detects the graduation number B(s) of the linear scale 33 at the first position by the first encoder head 17. Next, while acquiring an image by the first camera 16, the control unit 50 moves the first base 10 and the second base 20 until the optical axis 16z of the first camera 16 comes to the position of the position mark Me. Then, when the optical axis 16z of the first camera 16 comes to the second position of the position mark Me, the graduation number B(e) of the linear scale 33 is detected by the first encoder head 17. Then, the control unit 50 calculates, from the difference=(B(e)−B(s)) between the graduation number B(s) at the first position and the graduation number B(e) at the second position, the graduation number difference NB=(B(e)−B(s)) of the linear scale 33 when the first base 10 and the second base 20 move by the reference distance Lr.

Similar to the above operation, when the graduation number difference NB is detected, the control unit 50 proceeds to step S202 of FIG. 4 and corrects the position correction coefficient k(n) by the following (Equation 5).

$$ka(n)=k(n)\times[NB\times p]/Lr \quad \text{(Equation 5)}$$

As described above, similar to the operation described above, it is possible to improve the position detection precision of the first bonding head 13, the second bonding head 23, the first camera 16 and the second camera 26, and suppress reduction in the mounting precision of electronic components. Besides, in the above description, the graduation numbers of the linear scale 33 when the first base 10 is at the first position and the second position are detected by the first encoder head 17. However, it may be that the graduation numbers of the linear scale 33 when the second base 20 is at the first position and the second position are detected by the second encoder head 27.

This embodiment has the same effects as the embodiment described above.

In the description of the embodiment described above, the first base 10 and the second base 20 are moved by the reference distance Lr by aligning the optical axis 16z of the first camera s 16 and the optical axis 26z of the second camera 26 with the position marks Ms and Me, but the position correction coefficient k(n) may be corrected by the following method.

The first base 10 is moved to a position where the position mark Ms enters the field of view of the first camera 16, the image of the position mark Ms is captured, and a distance d1(not shown) between the optical axis 16z of the first camera 16 and the position mark Ms is detected. In addition, the graduation number B(s) of the linear scale 33 is detected by the first encoder head 17. Next, the first base 10 is moved to a position where the position mark Me enters the field of view of the first camera 16, the image of the position mark Me is detected by the first camera 16, and a distance d2 between the optical axis 16z of the first camera 16 and the position mark Me is detected. Then, a distance that takes the distances d1 and d2(not shown) into consideration for the reference distance Lr is acquired as an approximate reference distance Lr1. In addition, the graduation number B(e) of the linear scale 33 is detected by the first encoder head 17.

Then, from the graduation number difference NB=(B(e)−B(s)) and the approximate reference distance Lr1, the position correction coefficient k(n) is corrected by the following (Equation 6).

$$ka(n)=k(n)\times[NB\times p]/Lr1 \quad \text{(Equation 6)}$$

<Configuration of Mounting Device of Another Embodiment>

Next, a configuration of a flip-chip bonding device 200 which is another mounting device is described with reference to FIGS. 6-9.

Figure 6:
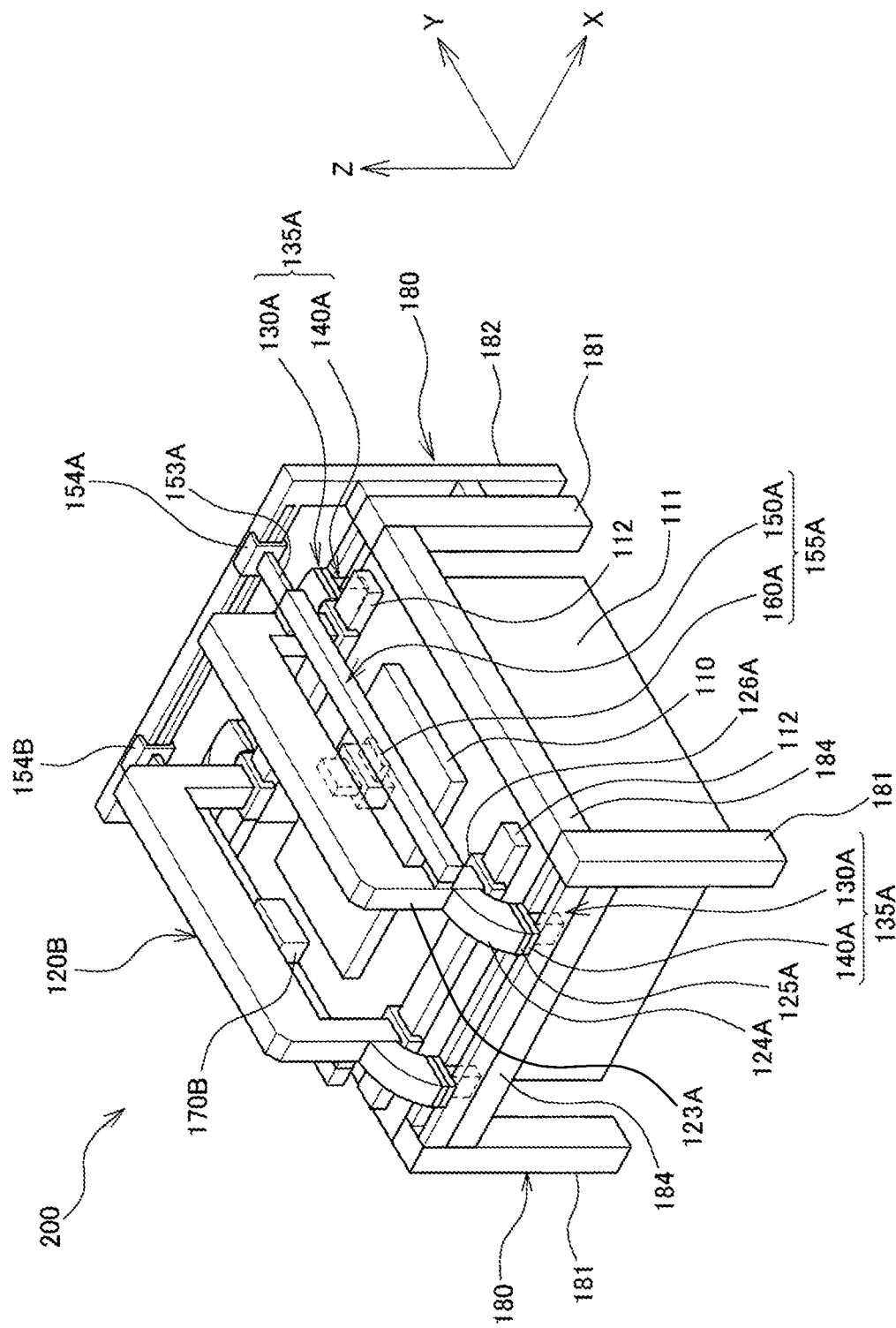
FIG. 6 is a perspective view showing a configuration of a flip-chip bonding device of another embodiment.

As shown in FIG. 6, the flip-chip bonding device 200 of the embodiment includes: a main gantry 111, a first gantry frame 120A and a second gantry frame 120B supported on the main gantry 111 and extending in parallel toward the Y-direction, a first mounting head 170A and a second mounting head 170B supported by the first gantry frames 120A and the second gantry frame 120B, a first X-direction linear motor 135A and a second X-direction linear motor 135 for driving the first gantry frame 120A and the second gantry frame 120B in the X-direction, and a first Y-direction linear motor 155A and a second Y-direction linear motor 155B for driving the first mounting head 170A and the second mounting head 170B in the Y-direction, a sub-gantry 180 disposed apart from the main frame 111, and a first Y-direction load receiver 154A and a second Y-direction load receiver 154B attached to the sub-gantry 180. One end of a first Y-direction stator 150A of the first Y-direction linear motor 155A and one end of a second Y-direction stator 150B of the second Y-direction linear motor 155B are connected to the first Y-direction load receiver 154A and the second Y-direction load receiver 154B by a first connection member 153A and a second connection member 153B. Besides, the X-direction and the Y-direction are directions orthogonal to each other on the horizontal plane, and in the embodiment, as shown in FIG. 1, a direction in which the first gantry frame 120A and the second gantry frame 120B extend is described as the Y-direction, and a direction orthogonal to this direction is described as the X-direction. In addition, the Z-direction is an up-down direction perpendicular to the XY plane.

Figure 7:
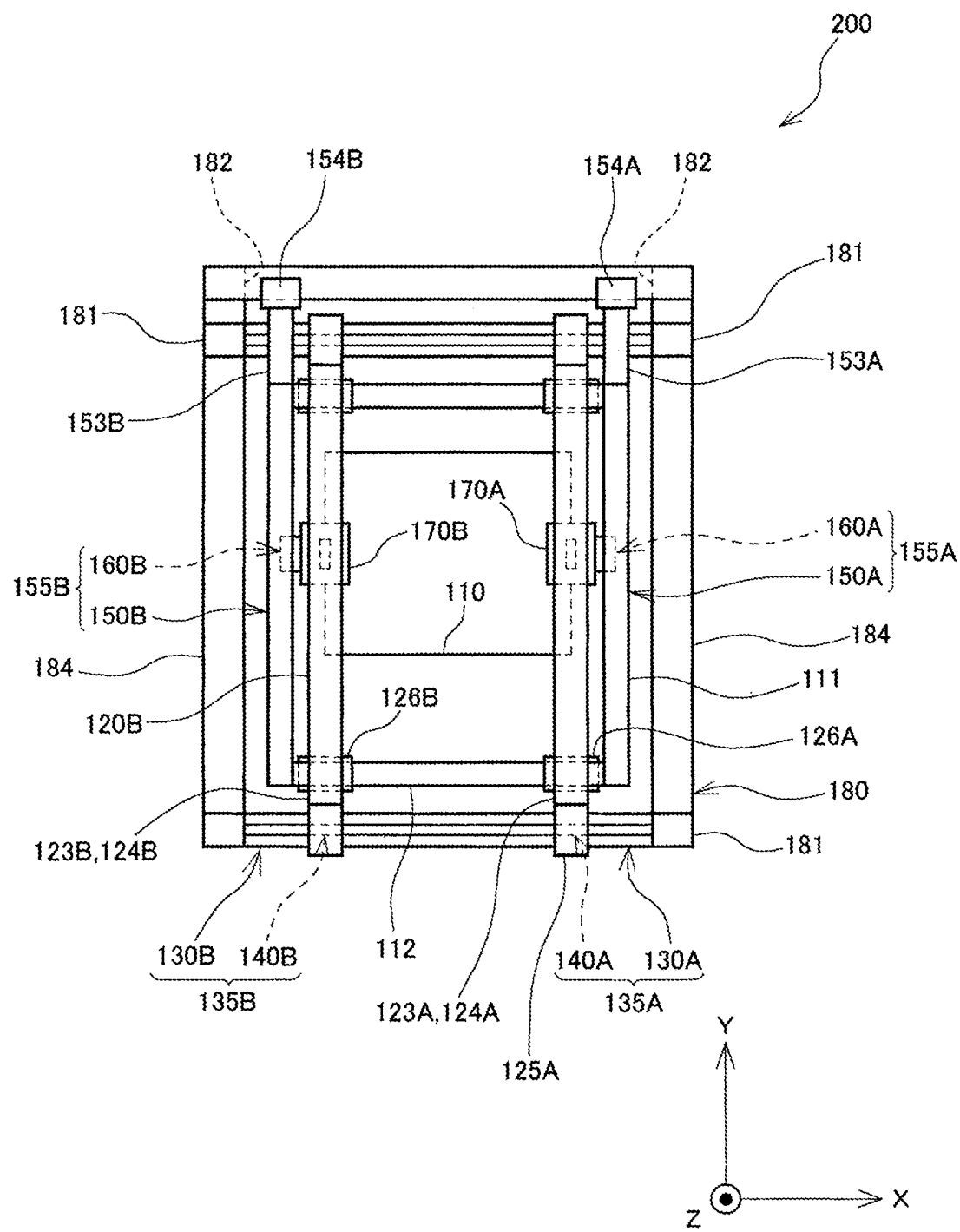
FIG. 7 is a plan view of the flip-chip bonding device shown in FIG. 6.
Figure 8:
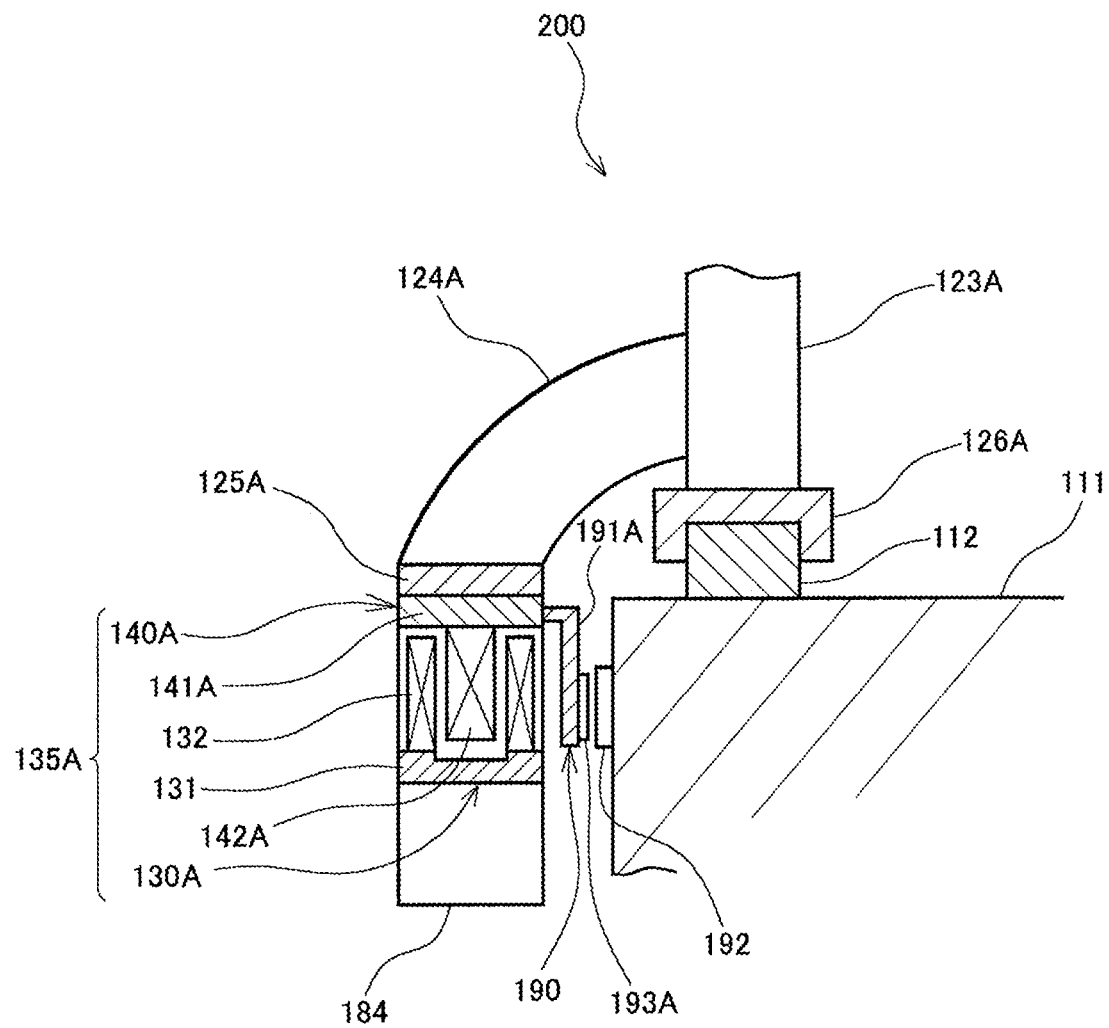
FIG. 8 is a side view showing an arrangement of gantry frames and a linear scale of the flip-chip bonding device shown in FIG. 6.

As shown in FIG. 1, the main gantry 111 is a gantry having a rectangular plane, and the mounting stage 110 is attached to the upper surface of the main gantry 111. The mounting stage 110 vacuum-attracts the substrate 19 on which a semiconductor die is mounted. Two linear guides 112 are attached in parallel with each other near two opposite sides of the upper surface of the main gantry 111. As shown in FIGS. 6-8, a first slider 126A and a second slider 126B are attached onto the linear guides 112 so as to be movable in the X-direction. Then, on the respective sliders 126A and 126B of the two linear guides 112, a first leg 123A of the first gantry frames 120A and a second leg 123B of the second gantry frame 120B are respectively attached. In other words, the first gantry frame 120A and the second gantry frame 120B extend in the Y-direction so as to pass over the main gantry 111, and the legs 123A and 123B at both ends are attached to the respective sliders 126A and 126B and supported by the linear guides 112 attached to the gantry 111 so as to be movable in the X-direction.

In addition, as shown in FIG. 6, the flip-chip bonding device 200 of the embodiment includes the sub-gantry 180 separated from the main gantry 111 so as to surround the periphery of the main gantry 111. The sub-gantry 180 is a frame configured by columns 181 and 182 and a beam 184. As shown in FIGS. 6 and 8, a first X-direction stator 130A of the first X-direction linear motor 135A and a second X-direction stator 130B of the second X-direction linear motor 135B is attached onto the beam 184 extending in the X-direction. As shown in FIG. 8, the first X-direction stator 130A and the second X-direction stator 130B are disposed opposite to a permanent magnet 132 with a space therebetween on a support plate 131. In the space between the permanent magnet 132 of the first X-direction stator 130A and the second X-direction stator 130B, a first coil 142A of a first X-direction mover 140A of the first X-direction linear motor 135A and a second coil 142B of a second X-direction mover 140B of the second X-direction linear motor 135B are disposed. The first coil 142A and the second coil 142B are fixed to a first base plate 141A and a second base plate 141E on the upper side, and the first base plate 141A and the second base plate 141B are fixed, by bolts or the like, to a first flat plate 125A and a second flat plate 125B attached to the front ends of a first arm 124A and a second arm 124B extending from the first leg 123A of the first gantry frames 120A and the second leg 123B of the second gantry frame 120B. Accordingly, the X-direction movers 140A and 140B of the X-direction linear motors 135A and 135B move in the X-direction together with the gantry frames 120A and 120B.

As shown in FIG. 8, the first X-direction mover 140A and the second X-direction mover 140B are attached to the first X-direction stator 130A and the second X-direction stator 130B. Parts of the first X-direction stator 130A and the second X-direction stator 130B to which the X-direction movers 140A and 140B are combined respectively form the first X-direction linear motor 135A and the second X-direction linear motor 135B.

In addition, as shown in FIG. 8, a linear scale 192 of a linear encoder 190 extending linearly toward the X-direction is attached to the side surfaces of the first X-direction mover 140A and the second X-direction mover 140B of the main frame 111, and a first encoder head 193A and a second encoder head 193B of the linear encoder 190 are attached to the front ends of a first lug 191A and a second lug 191B being L-shaped and extending from the first X-direction mover 140A and the second X-direction mover 140B toward the main gantry 111 side. In this manner, the first encoder head 193A and the second encoder head 193B are attached to the ends of the first gantry frame 120A and the second gantry frame 120B on the linear scale 192 side.

Figure 9:
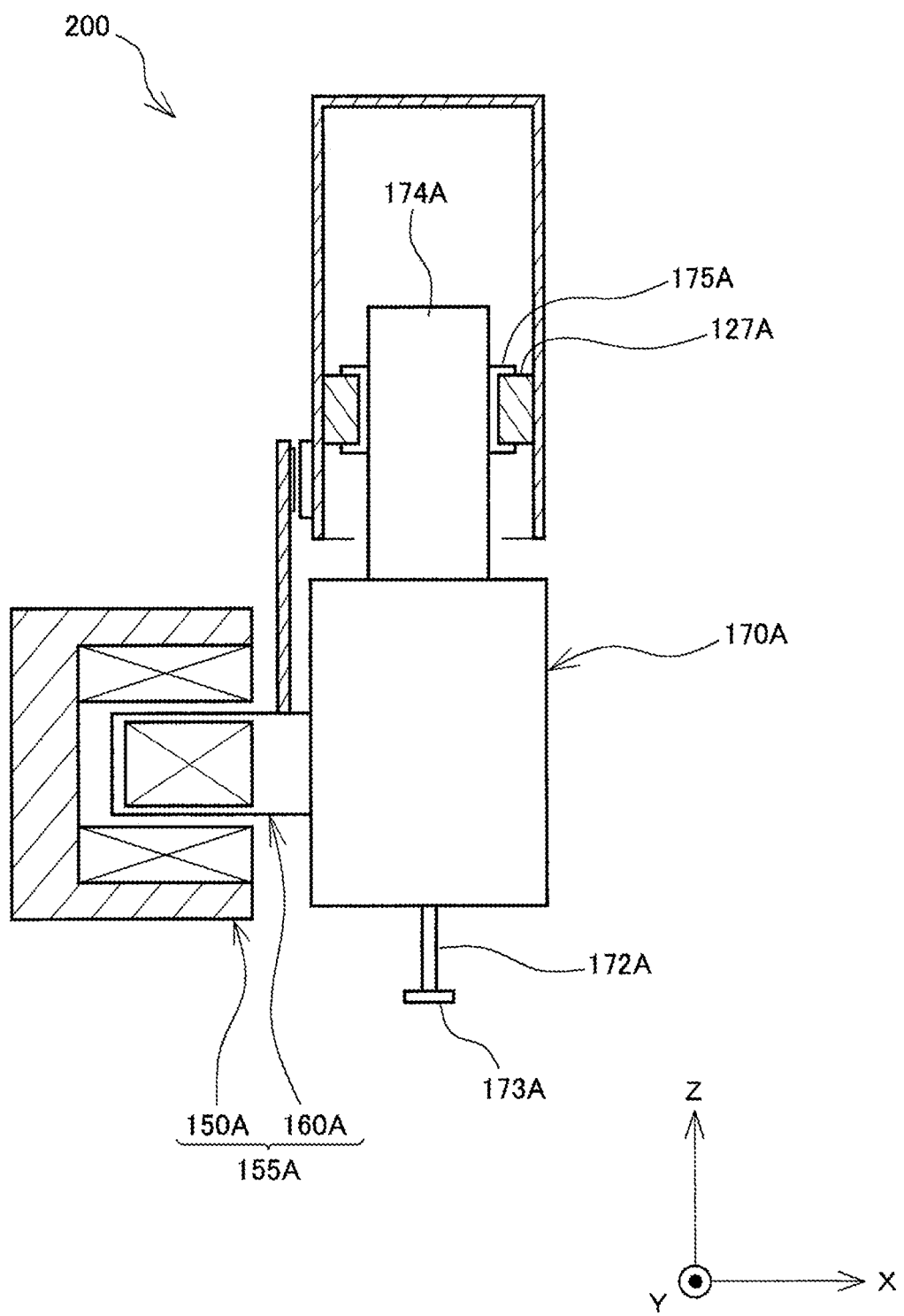
FIG. 9 is a cross-sectional view showing a configuration of the gantry frames of the flip-chip bonding device shown in FIG. 6.

As shown in FIGS. 6 and 9, the first mounting head 170A and the second mounting head 170B are supported by the first gantry frame 120A and the second gantry frame 120B.

As shown in FIG. 9, the first mounting head 170A and the second mounting head 170B store a Z-direction moving mechanism for vertically moving, in the Z-direction, the first shaft 172A and the second shafts 172B to which a first mounting tool 173A and a second mounting tool 173B are attached at the front ends. The Z-direction moving mechanism moves the first mounting tool 173A and the second mounting tool 173B up and down and presses the semiconductor die 15 onto the substrate 19 which is attracted and fixed to the mounting stage 110. A space is arranged inside the first gantry frame 120A and the second gantry frame 120B, and two first linear guides 127A and two second linear guides 127B extending in the Y-direction are attached to both sides of the inner surfaces. First sliders 175A and second sliders 175B are respectively attached to the linear guides 127A and 127B, and suspension members 174A and 174B of the mounting heads 170A and 170B are attached to the sliders 175A and 175B.

<Calculation Operation (Calculation Method) for Position Correction Coefficient k(n) of Linear Scale in Mounting Device>

Next, the calculation operation for the position correction coefficient k(n) of the linear scale 192 is described with reference to FIG. 10 and FIGS. 2-3. If the linear scale 192 thermally expands, an error may be generated when the first gantry frame 120A and the second gantry frame 120B are moved from the reference position of the flip-chip bonding device 200 to a predetermined position. Thus, the calculation operation (calculation method) for the position correction coefficient of the linear scale 192 is described below.

Figure 10:
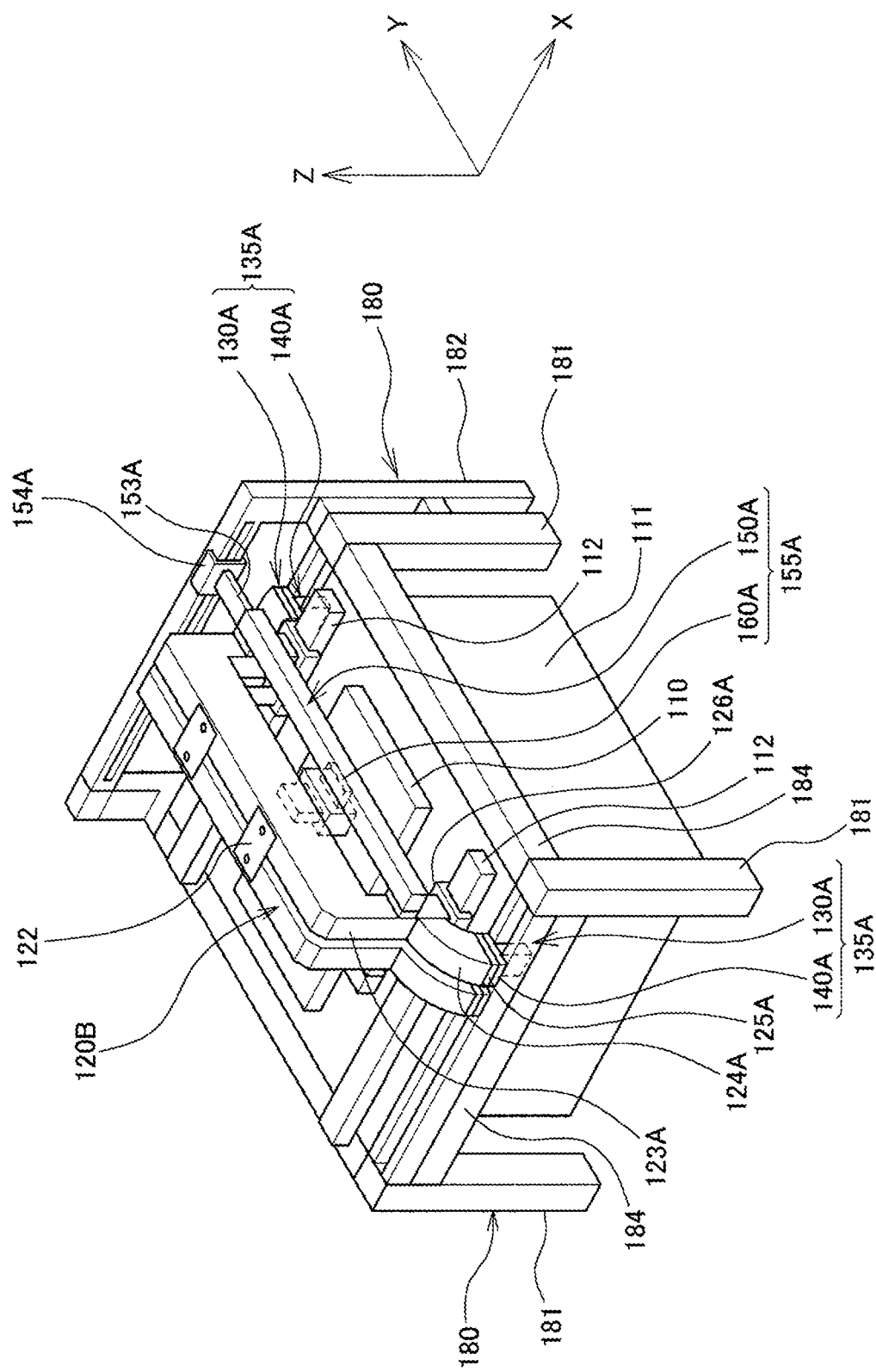
FIG. 10 is a perspective view showing a state in which a first gantry frame and a second gantry frame are temporarily connected in the flip-chip bonding device shown in FIG. 6.

As shown in FIG. 10, the first gantry frame 120A is set at the initial position, and the second gantry frame 120B is moved in the X-direction to a position adjacent to the first gantry frame 120A. Then, the first gantry frame 120A and the second gantry frame 120B are connected by a connection member 122. Thereby, the interval between the center of the first encoder head 193A and the center of the second encoder head 193B becomes the predetermined interval a shown in FIG. 3. Then, the control unit 50 initially sets n to 1 as shown in step S101 of FIG. 2.

Next, the control unit 50 drives the first X-direction linear motor 135A to move the first gantry frame 120A and the second gantry frame 120B in the X-direction. At this time, because the first gantry frame 120A and the second gantry frame 120B are connected by the connection member 122, the interval between the center of the first encoder head 193A and the center of the second encoder head 193B is maintained at the predetermined interval a. Then, as shown in step S102 of FIG. 2 and in FIG. 3, the control unit 50 aligns the center of the first encoder head 193A with the first graduation number B1(1) of the linear scale 192. Next, in step S103 of FIG. 2, the control unit 50 detects, by the laser distance detector 45, the position of the first gantry frame 120A in the X-direction at this time as a reference position.

As described above with reference to FIGS. 2 and 3, the control unit 50 linearly moves the first gantry frame 120A and the second gantry frame 120B by the predetermined number of graduations ΔB of the linear scale 192, and sequentially detects, by the first encoder head 193A and the second encoder head 193B, the first graduation number B1(n) of the linear scale 192 at which the center of the first encoder head 193A is positioned and the second graduation number B2(n) of the linear scale 192 at which the center of the second encoder head 193B is positioned. Then, the control unit 50 repeats the operation for calculating the position correction coefficient k(n) of the linear scale 192, which is the ratio of the predetermined interval a between the center of the first encoder head 193A and the center of the second encoder head 193B with respect to the distance A(n) between the center of the first encoder head 193A and the center of the second encoder head 193B detected by the linear scale 192. Thereby, the position correction coefficient k(n) of the linear scale 192 at each graduation number B(n) of the linear scale 192 can be calculated as shown in the graph of FIG. 3.

In addition, as described above with reference to FIGS. 4 and 5, the control unit 50 can correct the position correction coefficient k(n) and calculate the corrected position correction coefficient ka(n).

As described above, the flip-chip bonding device 200 of the embodiment linearly moves the first gantry frame 120A and the second gantry frame 120B in the X-direction by the predetermined number of graduations ΔB while maintaining the interval in the X-direction between the center of the first encoder head 193A and the center of the second encoder head 193B at the predetermined interval a, sequentially detects the graduation numbers by the first encoder head 193A and the second encoder head 193B to create a map of the position correction coefficient ka(n) of the linear scale 192, and corrects the positions of the encoder head 193A and 193B based on the created map of the position correction coefficient ka(n). Therefore, it is possible to improve the position detection precision of the mounting heads 170A and 170B and suppress reduction in the mounting precision of electronic components.

In the description of the embodiment described above, the first gantry frame 120A and the second gantry frame 120B are connected by the connection member 122, and the interval in the X-direction between the center of the first encoder head 193A and the center of the second encoder head 193B is maintained at the predetermined interval a. However, as in the embodiment described above with reference to FIGS. 2 and 3, the first gantry frame 120A and the second gantry frame 120B may be brought into contact with each other to maintain the interval in the X-direction between the center of the first encoder head 193A and the center of the second encoder head 193B at the predetermined interval a.

The embodiments of the present invention have been described using the mounting device 70 and the flip-chip bonding device 200 as examples, but the present invention is not limited to flip-chip bonding devices or die bonding devices and can be applied to various devices. For example, the present invention can be applied to wire bonding devices, industrial robots, and transport devices. The present invention can be applied to any device without limitation on the object to be transported or mounted, the size of the object, and the technical field of the object.

What is claimed is:

1. A device for linearly moving a first movable body comprising a first base and a second movable body comprising a second base with respect to an object, comprising:
the first movable body that is guided by a rail to move linearly,
the second movable body that is guided by the rail to move linearly,
a scale disposed along the rail and provided with a plurality of graduations at predetermined pitches along a moving direction,
a first detection unit that comprises a first encoder head and is disposed on the first movable body and detects graduation numbers of the scale, a second detection unit that comprises a second encoder head and is disposed on the second movable body and detects graduation numbers of the scale, and a control unit, comprising a computer that includes a CPU that performs information processing therein, and a memory in which operation programs and data are stored, and controlling a moving amount of the first movable body and the second movable body, wherein the control unit maintains an interval between the first detection unit and the second detection unit to be constant and moves the first movable body and the second movable body along the rail from a movement start position to a movement end position while sequentially detecting, by the first detection unit and the second detection unit, a first graduation number at which the first detection unit is positioned and a second graduation number at which the second detection unit is positioned, and calculates a distance on the scale between the first detection unit and the second detection unit by multiplying a difference between the first graduation number and the second graduation number by the pitch of the scale, and calculates a position correction coefficient of the scale as a ratio of the interval between the first detection unit and the second detection unit with respect to the calculated distance on the scale, and controls the movement amount of the first movable body and the second movable body based on the position correction coefficient of the scale.

2. The device according to claim 1, wherein
each of the first movable body and the second movable body is a transport mechanism that transports a semiconductor die to the object;
the object is a substrate on which the semiconductor die that has been transported is mounted or other semiconductor die; and
the device is for mounting the semiconductor die on the object.

3. The device according to claim 2, further comprising:
a first driving unit that drives the first movable body, and
a second driving unit that drives the second movable body;
wherein the control unit drives one of the first driving unit or the second driving unit to press one of the first movable body or the second movable body against the other, and simultaneously moves the first movable body and the second movable body while maintaining the interval between the first detection unit and the second detection unit at the predetermined interval.

4. The device according to claim 2, comprising
a mounting stage for mounting electronic components;
wherein the rail is two linear guides extending in an X-direction;
the first movable body is a first gantry frame which extends in a Y-direction so as to pass over the mounting stage and of which both ends are guided by the two linear guides to move in the X-direction, and
the second movable body is a second gantry frame which extends in the Y-direction in parallel with the first gantry frame so as to pass over the mounting stage and of which both ends are guided by the two linear guides to move in the X-direction;
the scale is disposed along one of the linear guides;
the first detection unit is attached to the end of the first gantry frame on the scale side, and
the second detection unit is attached to the end of the second gantry frame on the scale side.

5. The device according to claim 1, comprising
a distance detector that comprises a laser distance detector and detects a distance of the first movable body or the second movable body from a reference position;
wherein the control unit
moves the first movable body and the second movable body by a reference distance while maintaining the first detection unit and the second detection unit at the interval and detecting the distance of the first movable body or the second movable body from the reference position by the distance detector, detects, by the first detection unit and the second detection unit, a graduation number difference of the scale before and after moving the first movable body and the second movable body by the reference distance, and
corrects the movement amount based on the reference distance and the graduation number difference.

6. The device according to claim 5, comprising
a mounting stage for mounting electronic components;
wherein the rail is two linear guides extending in an X-direction;
the first movable body is a first gantry frame which extends in a Y-direction so as to pass over the mounting stage and of which both ends are guided by the two linear guides to move in the X-direction, and
the second movable body is a second gantry frame which extends in the Y-direction in parallel with the first gantry frame so as to pass over the mounting stage and of which both ends are guided by the two linear guides to move in the X-direction;
the scale is disposed along one of the linear guides;
the first detection unit is attached to the end of the first gantry frame on the scale side, and
the second detection unit is attached to the end of the second gantry frame on the scale side.

7. The device according to claim 1, further comprising:
a first driving unit that drives the first movable body, and
a second driving unit that drives the second movable body;
wherein the control unit drives one of the first driving unit or the second driving unit to press one of the first movable body or the second movable body against the other, and simultaneously moves the first movable body and the second movable body while maintaining the interval between the first detection unit and the second detection unit at the interval.

8. The device according to claim 7, comprising
a mounting stage for mounting electronic components;
wherein the rail is two linear guides extending in an X-direction;
the first movable body is a first gantry frame which extends in a Y-direction so as to pass over the mounting stage and of which both ends are guided by the two linear guides to move in the X-direction, and
the second movable body is a second gantry frame which extends in the Y-direction in parallel with the first gantry frame so as to pass over the mounting stage and of which both ends are guided by the two linear guides to move in the X-direction;
the scale is disposed along one of the linear guides;
the first detection unit is attached to the end of the first gantry frame on the scale side, and
the second detection unit is attached to the end of the second gantry frame on the scale side.

9. The device according to claim 1, comprising
a mounting stage for mounting electronic components;
wherein the rail is two linear guides extending in an X-direction;
the first movable body is a first gantry frame which extends in a Y-direction so as to pass over the mounting stage and of which both ends are guided by the two linear guides to move in the X-direction, and
the second movable body is a second gantry frame which extends in the Y-direction in parallel with the first gantry frame so as to pass over the mounting stage and of which both ends are guided by the two linear guides to move in the X-direction;
the scale is disposed along one of the linear guides;
the first detection unit is attached to the end of the first gantry frame on the scale side, and
the second detection unit is attached to the end of the second gantry frame on the scale side.

10. The device according to claim 1, comprising:
a reference member comprising position marks disposed separated by a reference distance,
a first image acquisition part comprising a first camera attached to the first movable body and acquiring an image of the position marks, and
a second image acquisition part comprising a second camera attached to the second movable body and acquiring an image of the position marks;
wherein the control unit moves the first movable body and the second movable body by the reference distance based on the image of the position marks obtained by the first image acquisition part or the second image acquisition part, detects, by the first detection unit or the second detection unit, the graduation number difference of the scale before and after moving the first movable body and the second movable body, and
corrects the movement amount based on the reference distance and the graduation number difference.

11. The device according to claim 10, comprising
a mounting stage for mounting electronic components;
wherein the rail is two linear guides extending in an X-direction;
the first movable body is a first gantry frame which extends in a Y-direction so as to pass over the mounting stage and of which both ends are guided by the two linear guides to move in the X-direction, and
the second movable body is a second gantry frame which extends in the Y-direction in parallel with the first gantry frame so as to pass over the mounting stage and of which both ends are guided by the two linear guides to move in the X-direction;
the scale is disposed along one of the linear guides;
the first detection unit is attached to the end of the first gantry frame on the scale side, and
the second detection unit is attached to the end of the second gantry frame on the scale side.

12. The device according to claim 1, comprising
a mounting stage for mounting electronic components;
wherein the rail is two linear guides extending in an X-direction;
the first movable body is a first gantry frame which extends in a Y-direction so as to pass over the mounting stage and of which both ends are guided by the two linear guides to move in the X-direction, and
the second movable body is a second gantry frame which extends in the Y-direction in parallel with the first gantry frame so as to pass over the mounting stage and of which both ends are guided by the two linear guides to move in the X-direction;
the scale is disposed along one of the linear guides;
the first detection unit is attached to the end of the first gantry frame on the scale side, and
the second detection unit is attached to the end of the second gantry frame on the scale side.

13. A method for linearly moving a first movable body comprising a first base and a second movable body comprising a second base with respect to an object, comprising:
a step for preparing a device comprising the first movable body that is guided by a rail to move linearly, the second movable body that is guided by the rail to move linearly, a scale disposed along the rail and provided with a plurality of graduations at predetermined pitches along a moving direction, a first detection unit comprising a first encoder head and disposed on the first movable body, and a second detection unit comprising a second encoder head and disposed on the second movable body;
a graduation number detection step for maintaining an interval between the first detection unit and the second detection unit to be constant and moving the first moving portion and the second moving portion along the rail, while sequentially detecting, by the first detection unit and the second detection unit, a first graduation number at which the first detection unit is positioned and a second graduation number at which the second detection unit is positioned;
calculating a distance on the scale between the first detection unit and the second detection unit by multiplying a difference between the first graduation number and the second graduation number by the pitch of the scale, and calculating a position correction coefficient of the scale as a ratio of the interval between the first detection unit and the second detection unit with respect to the calculated distance on the scale; and
a movement amount control step for controlling a movement amount of the first movable body and the second movable body based on the position correction coefficient of the scale.

14. The method according to claim 13, wherein
the device comprises a distance detector that comprises a laser distance detector and detects a distance of the first movable body or the second movable body from a reference position; and
the method comprises a movement amount correction step for maintaining the first detection unit and the second detection unit at the interval, detecting the distance of the first movable body or the second movable body from the reference position by the distance detector while moving the first movable body and the second movable body by a reference distance, detecting, by the first detection unit or the second detection unit, a graduation number difference of the scale before and after moving the first movable body and the second movable body by the reference distance, and correcting the movement amount based on the reference distance and the graduation number difference.

15. The method according to claim 13, wherein
the device comprises a reference member comprising position marks disposed separated by a reference distance, a first image acquisition part comprising a first camera attached to the first movable body and acquiring an image of the position marks, and a second image acquisition part comprising a second camera attached to the second movable body and acquiring an image of the position marks; and the method comprises a movement amount correction step for moving the first movable body and the second movable body by the reference distance based on the image of the position marks obtained by the first image acquisition part or the second image acquisition part, detecting, by the first detection unit or the second detection unit, a graduation number difference of the scale before and after moving the first movable body and the second movable body, and correcting the movement amount based on the reference distance and the graduation number difference.

\* \* \* \* \*